United States Patent [19]

Durand et al.

[11] Patent Number: 5,631,191
[45] Date of Patent: May 20, 1997

[54] METHOD FOR CONNECTING A DIE TO ELECTRICALLY CONDUCTIVE TRACES ON A FLEXIBLE LEAD-FRAME

[75] Inventors: David Durand, Providence; Chon M. Wong, Lincoln; Roger A. Iannetta, Jr., Warwick, all of R.I.

[73] Assignee: Poly-Flex Circuits, Inc., R.I.

[21] Appl. No.: 440,924

[22] Filed: May 15, 1995

Related U.S. Application Data

[62] Division of Ser. No. 112,226, Aug. 27, 1993, abandoned.

[51] Int. Cl.$^6$ .................................................. H01L 21/60
[52] U.S. Cl. ...................... 437/206; 437/209; 437/211; 437/214; 437/217
[58] Field of Search ........................... 437/206, 209, 437/211, 214, 217, 218, 219, 220

[56] References Cited

U.S. PATENT DOCUMENTS

| | | | |
|---|---|---|---|
| 4,048,438 | 9/1977 | Zimmerman . | |
| 4,234,666 | 11/1980 | Gursky | 428/573 |
| 4,677,526 | 6/1987 | Machling | 361/718 |
| 4,744,850 | 5/1988 | Imano . | |
| 4,811,081 | 3/1989 | Lyden | 257/786 |
| 4,816,427 | 3/1989 | Dennis | 437/220 |
| 5,010,038 | 4/1991 | Fox et al. | 437/220 |
| 5,018,005 | 5/1991 | Lin . | |
| 5,053,357 | 10/1991 | Lin . | |
| 5,156,983 | 10/1992 | Schlesinger et al. | 437/206 |
| 5,212,402 | 5/1993 | Higgins, III | 437/206 |
| 5,224,264 | 7/1993 | Takahashi et al. | 437/206 |
| 5,341,027 | 8/1994 | Park et al. | 257/786 |
| 5,401,688 | 3/1995 | Yamaji et al. | 437/220 |

FOREIGN PATENT DOCUMENTS

| | | |
|---|---|---|
| 0265077 | 4/1988 | European Pat. Off. . |
| 0435093 | 7/1991 | European Pat. Off. . |
| 2332620 | 6/1977 | France . |
| 3414961 | 10/1984 | Germany . |
| 63-301534 | 4/1989 | Japan . |
| 3-104252 | 7/1991 | Japan . |

OTHER PUBLICATIONS

Ken Gilleo, PhD., "Direct Chip Interconnect Using Polymer Bonding", 39th Electronics Components Conference (1989) pp. 37–44.

*Primary Examiner*—Kevin M. Picardat
*Attorney, Agent, or Firm*—Cushman Darby & Cushman IP Group of Pillsbury Madison & Sutro LLP

[57] ABSTRACT

A polymer lead-frame is made from a flexible substrate with flexible conductive traces. The generally square lead-frame has diagonal cutouts partially extending from the corners towards the center, as well as a central hole that lies within a footprint of the die. The die is bonded directly to the lead frame, preferably with anisotropic, electrically conductive adhesive. The die is placed with the lead frame in a fixture. A holding force is applied to secure the die and, if necessary, a curing force is applied during a cure cycle. The fixture allows transport of the assembly to a curing oven and allows application of the curing force. The die has contact pads characterized by a non-planar, non-bump-like surface with concavities having depths of at least about one-seventh the diameter of conductive particles in the anisotropic conductive adhesive.

17 Claims, 6 Drawing Sheets

METHOD FOR CONNECTING A DIE TO ELECTRICALLY CONDUCTIVE TRACES ON A FLEXIBLE LEAD-FRAME

This is a division of application Ser. No. 08/112,226, filed Aug. 27, 1993, now abandoned.

BACKGROUND

The invention relates to the general field of die bonding, and in particular to a flexible polymer lead-frame.

Traditionally, most integrated circuits (IC's) have been connected using three metal connections. First, the die is wire-bonded to a lead-frame. Wire bonding connects one end of a fine metallic wire to an IC contact pad. The other end of the wire is connected to a metal lead-frame. The IC and part of the lead-frame are then sealed into a molded package to produce the well-known IC package. The leads of the package are then soldered to the circuit to produce a third connection.

So-called Chip-On-Board methods are similar to wire bonding but without a lead-frame. A bare die is first attached to a circuit board with pads facing away from the board. A drawn wire is then metal bonded to each IC pad and to a corresponding circuit board pad, then the assembly is encapsulated.

Tape Automated Bonding (TAB) is another connection methodology which produces a similar result to wire bonding. Metal foil laminated on a substrate is typically etched in a patterned array to form traces on a dielectric film. The copper traces typically extend over an opening which is sized to be slightly larger than the die. These extended portions are sometimes called fingers. The die is placed in the opening so that fingers can be metal-bonded to die contact pads. Ends of the traces away from the fingers can be connected to a substrate using other methods. The bonds from the copper trace to the die are sometimes called inner bonds, while the bonds from the copper trace to the substrate are sometimes called outer bonds. TAB is similar to wire bonding in that one end of a metal wire (etched trace) connects to the die while another end is attached to a circuit board.

Yet another approach solders dies directly to ceramic circuit boards, and is sometimes called a "flip chip" process. Rounded solder bumps are specially fabricated on the chip contact pads. A rigid substrate is provided with a matched set of contact points. After placing the chip, bumps down, on the substrate, the solder is reflowed.

Anisotropic conductive adhesives (sometimes called Z-axis adhesives) displaying unidirectional conductivity have been reported for outer bonds in a TAB process. The adhesive consists of a dielectric thermoplastic adhesive and nickel conductive particles. See "Direct Chip Interconnect Using Polymer Bonding," K. Gilleo, 1989, presented at the IEEE 39th Electronic Components Conference.

Attempts have been made to use conductive adhesives to bond dies directly to substrates, although they are reportedly not commercially applicable. See "Direct Chip Interconnect Using Polymer Bonding," K. Gilleo, 1989, pp. 41–42. Significant difficulties are associated with applying viscous adhesive to very small bonding sites, especially when bonding site pitch (center to center distance) is less than about 250 microns.

SUMMARY

The invention relates to a method for adhering a bare die to a flexible polymeric lead-frame using a combination of screen printing of flexible conductive traces on a flexible substrate and electrically conductive cements for bonding a bare die to the screened traces.

A Upilex-S polyimide substrate sheet is cleaned, and a pattern of conductive traces are screen printed in a pattern that has contact points in an inner bonding area that will mate to die contact pads. The contact points are coated with a layer of uncured anisotropic electrically conductive adhesive.

A die is precision placed on to the lead-frame, which is held in a transportable fixture or jig. A first holding force, such as vacuum applied through a cutout in the lead-frame, secures the die in its placed position. When necessary, additional force may be applied while the adhesive is being cured. The assembly is then tested electrically and encapsulated, leaving a lead-frame/die assembly.

The lead-frame/die assembly is connected to a flexible circuit substrate. Contact points in an outer bonding area of the lead-frame are mated to corresponding points on the flexible circuit substrate and joined by electrically conductive adhesive.

BRIEF DESCRIPTION OF THE DRAWINGS

The invention will be described in greater detail below with reference to attached drawings in which.

DETAILED DESCRIPTION OF THE PREFERRED EMBODIMENTS

The scope of the invention is defined by claims at the conclusion of this detailed description of the preferred embodiments. However, the organization, operation, advantages and objects of the invention can be more fully appreciated from the following description.

Lead-frame/Circuit Assembly

Figure 1:
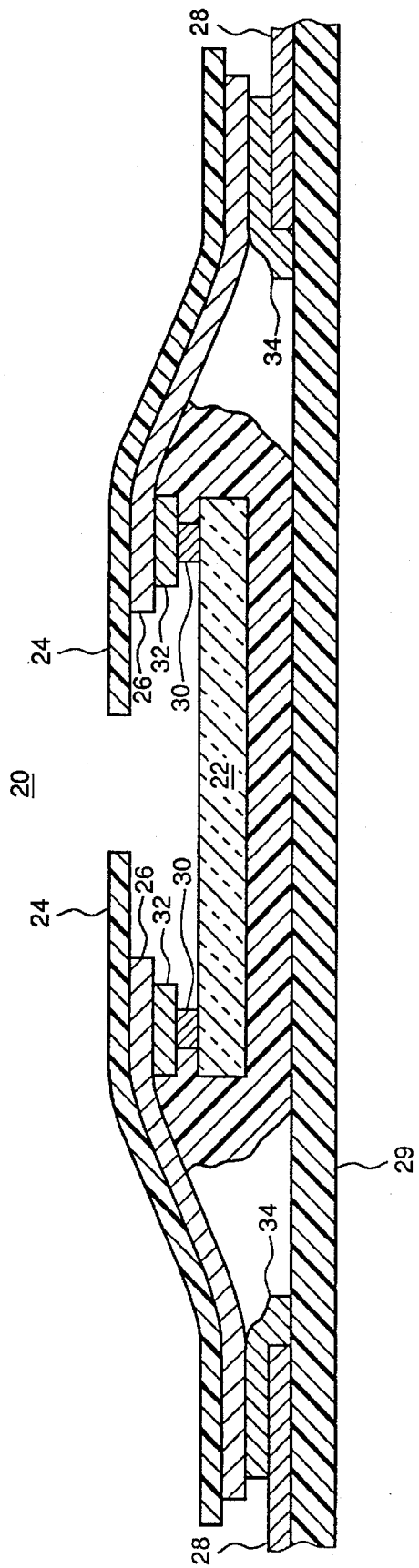
FIG. 1 illustrates a cross section of an assembly having a die attached to a flexible lead-frame, inverted and then attached to a flexible circuit.

FIG. 1 illustrates a cross section of a lead-frame/circuit assembly 20 having a die 22 adhered to a flexible lead-frame 24 that bears conductive traces 26. The lead-frame is inverted, and lead-frame traces 26 are adhered to flexible circuit traces 28 of a flexible substrate 29. The die 22 has contact pads 30 characterized by non-bump, non-planar surfaces as will be discussed in more detail below. An electrically conductive polymeric conductive adhesive 32 mechanically and electrically forms bonds between the die contact pads 30 to the lead-frame traces 26 in an inner bonding area. Similarly, electrically conductive adhesive 34 mechanically and electrically forms bonds between traces of the lead-frame in an outer bonding area and traces of the substrate.

Figure 2:
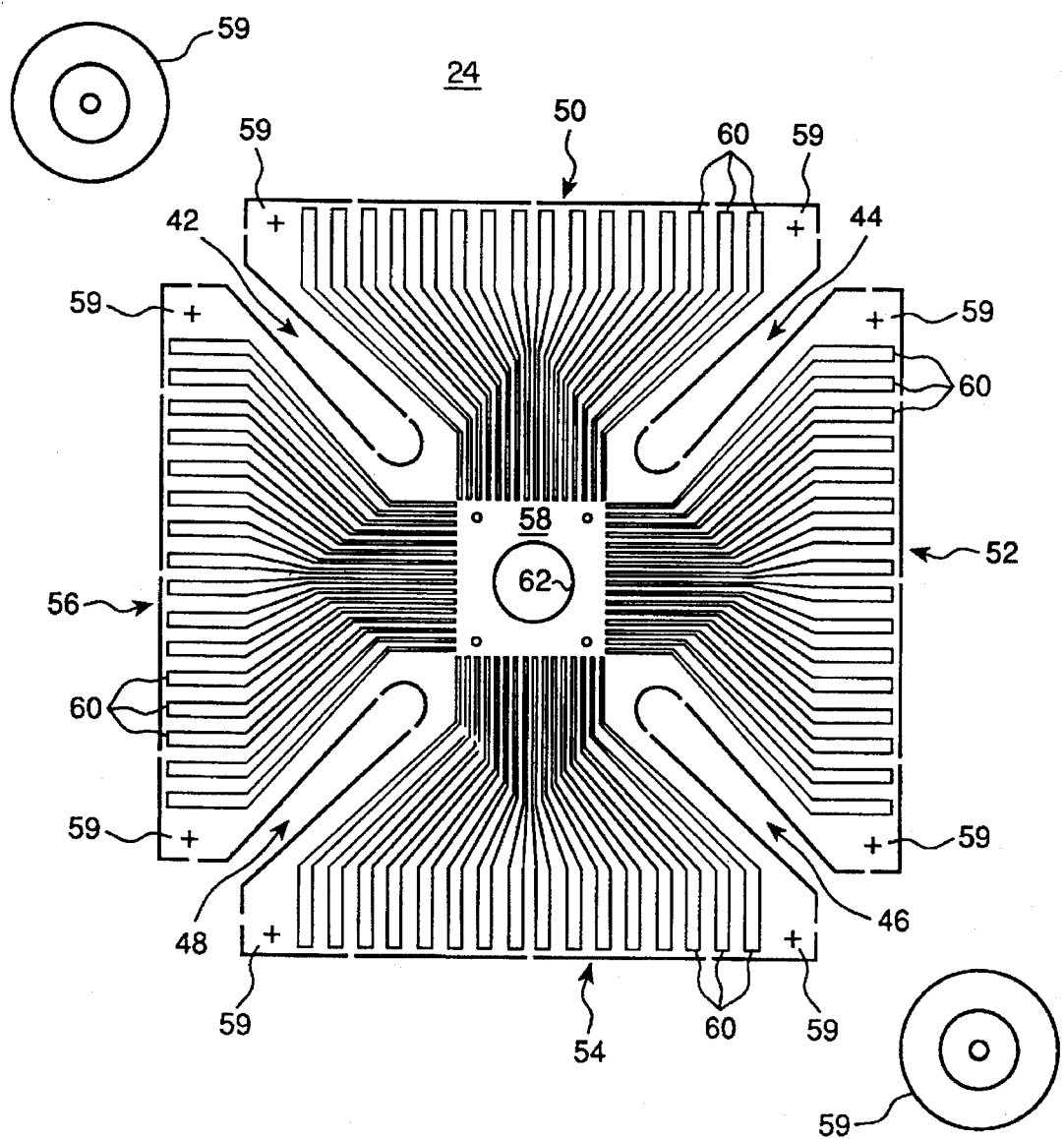
FIG. 2 illustrates a front view of a flexible lead-frame.

FIG. 2 illustrates a front view of a flexible lead-frame 24. The generally square substrate sheet is about six-tenths of an inch down a side and has four diagonal cutouts 42, 44, 46, 48, one cutout extending from each corner approximately two-thirds to three-fourths of the way to the center. Cutouts may be less than one-tenth of an inch wide and terminate near the center with a rounded shape to prevent tearing. The cutouts separate four, generally trapezoidal, outer bonding areas 50, 52, 54, 56, which are all connected to a central square inner bonding area 58.

Each outer bonding area 50, 52, 54, 56 has electrically conductive traces 60 that begin along the outer edge and converge as they approach the inner bonding area 58. Registration marks 59 may also be located in the outer bonding area and/or outside the lead frame perimeter.

Within the inner bonding area 58, the electrically conductive traces 60 terminate in a pattern that can be tailored to match a pattern of bonding pads on a die 22 to be mounted. The projection of the die 22 onto the flexible lead-frame 24 is designated here as the footprint. A central circular cutout 62 located in the center of the inner bonding area 58 has an area contained entirely within the die footprint. The diameter of central circular cutout 62 and its shape can also be tailored for different dies.

The diagonal cutouts 42, 44, 46, 48 decouple the four outer bonding areas 50, 52, 54, 56 giving the flexible lead-frame 24 additional flexibility. For example, when the flexible lead-frame 24 is inverted and applied to a substrate 29 (as shown in FIG. 1), the die 22 will cause a bulge in the center. A fully-connected flexible planar sheet (without cutouts) will have different bending modes will the flexible lead-frame with diagonal cutouts, and bending of one individual outer bonding area 50, 52, 54, 56 will induce less stress in other areas. The diagonal cutouts 42, 44, 46, 48 also decouple mechanical vibration and act as somewhat independent suspension members.

Assembly Procedure

Prior to assembling the structure shown in FIG. 1, an integrated circuit is fabricated, and bare dies 22 are made available using methods that fall within the art of IC design and fabrication. A flexible lead-frame 24 as described above, or one of modified design, is also prepared, preferably by printing a silver-based, heat or UV curable conductive polymer ink onto a flexible substrate using methods that fall within the art of polymer thick film circuit design and fabrication.

An effective amount of curable, electrically conductive adhesive is applied to the inner bonding area 58 of flexible lead-frame 24. In one application method, an isotropic, flexible conductive adhesive is stenciled directly onto a flexible lead-frame in a pattern of dots that matches the pattern of die contact pads. In another application method, an anisotropic, flexible conductive adhesive is applied over a region that encompasses the termini of the conductive traces in the inner bonding area. The anisotropic adhesive may bridge spaces between conductive traces. One suitable anisotropic adhesive is LZSP 8155 Z-Axis conductive epoxy, available from A. I. Technology, Inc. of Princeton, N.J., U.S.A. Preferred adhesives will provide contact resistance of less than 100 milli-ohm/mm$^2$, preferably less than 50 milli-ohm/mm$^2$, and optimally less than 10 milli-ohm/mm$^2$.

Figure 3:
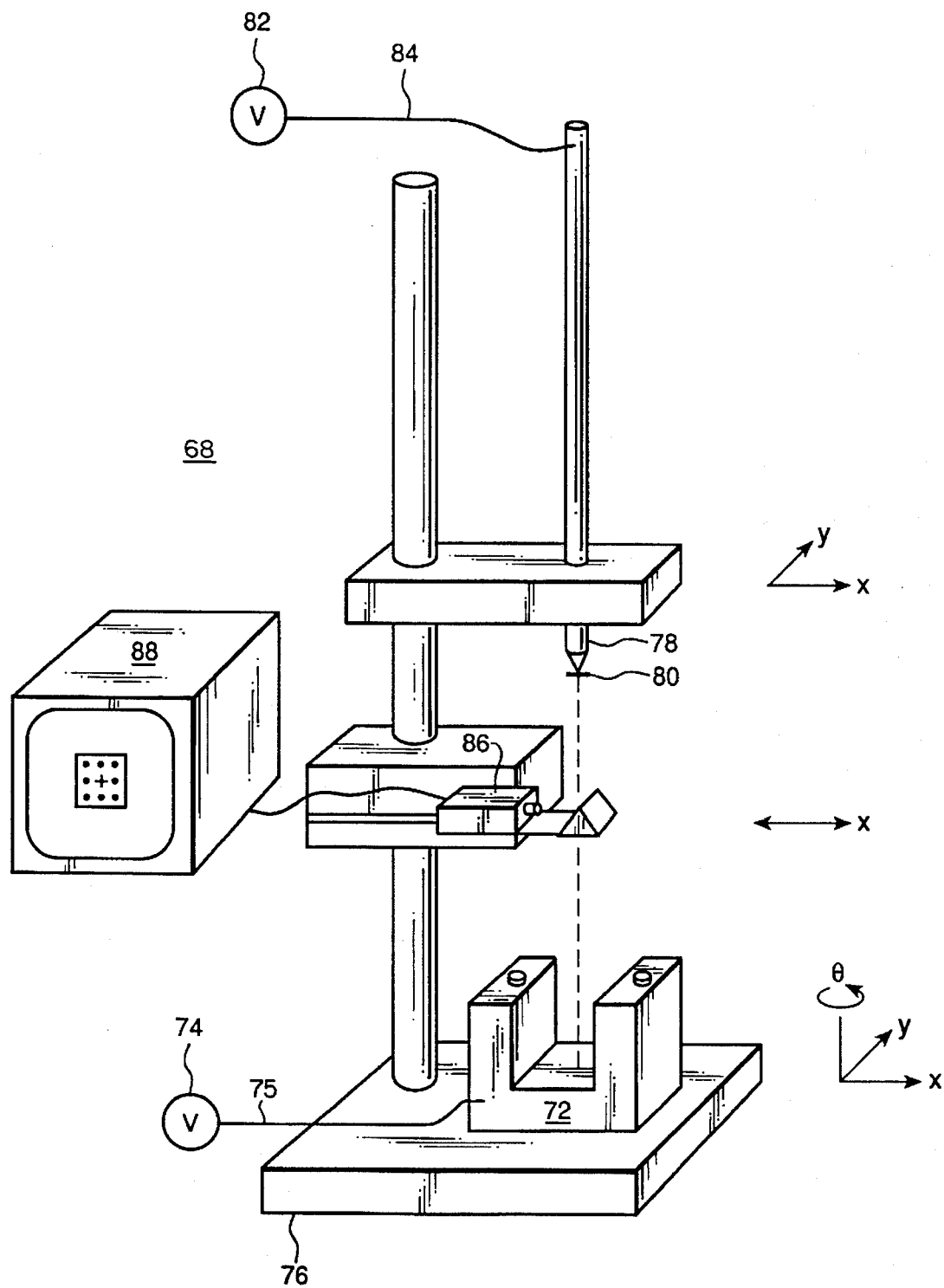
FIG. 3 illustrates a die bonding apparatus.

The flexible lead-frame 24 is aligned with a die 22 to be connected. In a suitable method, the flexible lead-frame 24 and die 22 are mounted in a die bonding apparatus 68, an example of which is illustrated in FIG. 3.

The die bonding apparatus 68 has a base 76 on which is mounted a removable vacuum jig 72 for holding a flexible lead-frame (not shown). A vacuum source 74 is applied by hose 75 to the jig. The jig alignment can be adjusted in three degrees of freedom: X, Y and theta. The X and Y directions are in a plane parallel to the base, while Theta is a rotation about an axis normal to the X-Y plane. The precise mechanisms for X,Y and Theta adjustments are not critical as long as they provide accuracy sufficient to align and place dies. The details are not illustrated here so as not to obscure the more important aspects of the process. Details of an exemplary jig will be discussed in more detail below.

The die bonding apparatus 68 also has a vacuum chuck 78 for holding a bare die 80. A vacuum source 82, which may be same source as for the jig 72, is applied by hose 84 to the vacuum chuck 78. The vacuum chuck 78 can be aligned in the X and Y directions, and translated in a direction normal to the X-Y plane so as to move the bare die 80 down to the jig 72 and into contact with the lead-frame (not shown). The precise mechanisms for X and Y adjustments of the chuck and for precision translation to the removble jig 72 are not critical as long as they provide accuracy sufficient to align and place dies. The details are not illustrated here so as not to obscure the more important aspects of the process.

The die bonding apparatus 68 also has a precision mechanism for aligning a bare die 80 with the flexible lead-frame The precise mechanism is not critical as long as it is capable of placing the die with sufficient accuracy so that the pattern of bonding pads on the bare die 80 substantially aligns with the pattern of traces in the inner bonding region 58 of the flexible lead-frame 24. One suitable alignment mechanism illustrated in FIG. 3 uses a video imaging device 86 connected to a video monitor 88. The video imaging device 86 may switchably view either the bare die 80 or the flexible (not shown) along the jig's axis of rotation. It should be understood that there are many alignment methods, some of which may be direct-optical (non-video), and some of which may be fully automatic. An exemplary die-bonding apparatus is available as model #503M from MRSI Chelmsford, Mass. The positioning method will be described below after first describing the removable jig 72.

Figure 4:
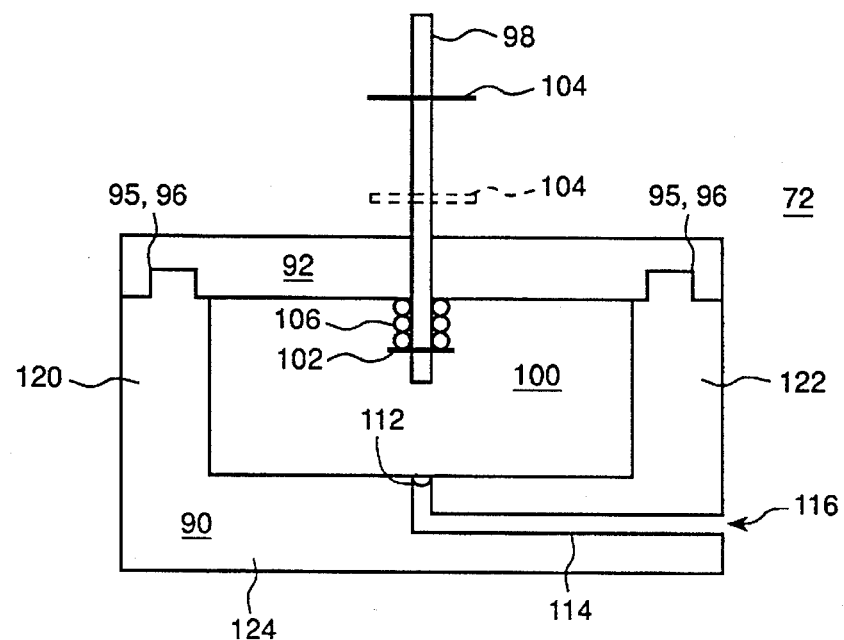
FIG. 4 illustrates a jig with top.

FIG. 4 illustrates a side view of a removable jig 72 which has a channel-shaped base 90 and a generally square lid 92. The channel-shaped base 90 has a floor 124 and left and right opposing walls 120, 122 which, together with the lid 92, bound an interior region 100 on four sides. The left and right walls 120, 122 have locator pins 95 which mate to registration holes 96 in the lid 92 so as to accurately center a rod-shaped plunger 98. The rod-shaped plunger 98 extends through a hole in the lid from above and into the interior region 100 of the channel-shaped base 90. A lower retaining rod 102 crosses the lower end of the rod-shaped plunger 98 like a cotter pin and retains a spring 106 concentrically mounted around the rod-shaped plunger 98. The spring force biases the rod-shaped plunger down against the base 90. An upper retaining rod 104 crosses the upper end of the rod-shaped plunger 98 to limit the rod-shaped plunger's downward travel.

A central vacuum port 112 is located in the floor 124 of the channel-shaped 90 immediately below, and aligned with the rod-shaped plunger 98. A vacuum channel 114 passing through the floor 124 connects the vacuum port 112 to a vacuum connection 116 along an outer edge of the channel-shaped base 90.

Figure 5:
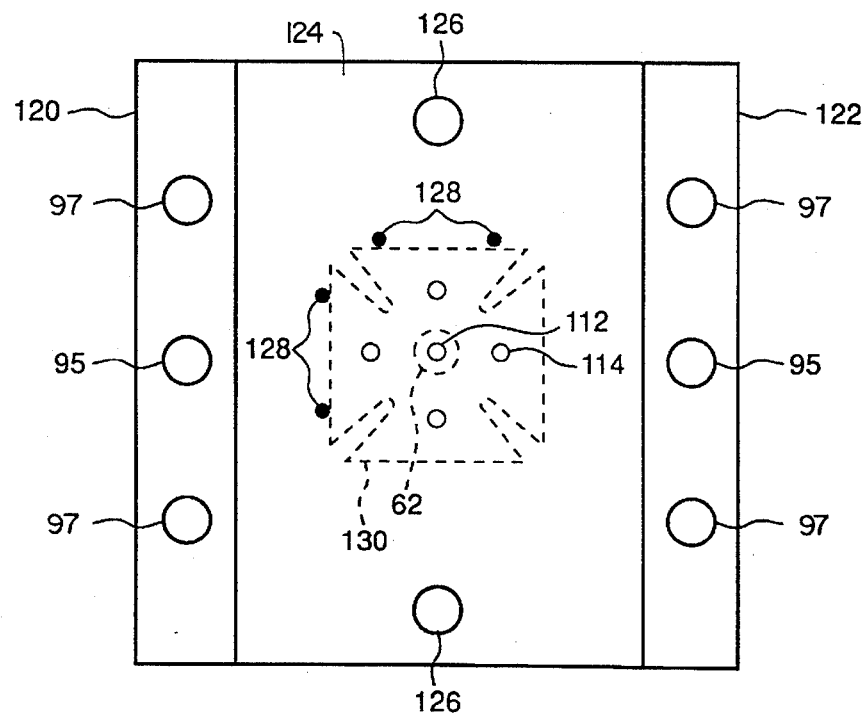
FIG. 5 illustrates a jig base.

FIG. 5 illustrates a top view of the channel-shaped base 90 with the square lid 92 removed. Locator pins 95 are shown on the tops of the left and right opposing walls 120, 122. Threaded holes 97, also located on the tops of the left and right opposing walls 120, 122, accept hold-down screws (not shown) to secure the square lid 92 to the channel-shaped base 90. (The square lid 92 has corresponding holes for the hold-down screws, which are not shown.)

The floor has two registration holes 126 which align with pins or screw holes in the base of the die bonding apparatus (not shown) so that the removable jig 72 can be placed repeatable and accurately in the die bonding apparatus 68. The floor 124 also has four pegs 128 protruding up into the interior region 100 which act as lead-frame stops. A lead-frame 130 is shown in dashed lines against the pegs 128. The pegs 128 are positioned so that, when a lead-frame is inserted into the removable jig 72, the central lead-frame cutout 62 aligns with the central vacuum port 112. The floor 124 may also have additional lateral vacuum ports 114 positioned to align with outer bonding areas of the lead-frames. These ports additional lateral vacuum 114 connect to an independent vacuum channel in the floor 124 (not shown) so that vacuum pressure can be selectively applied to the central port 112, the additional lateral vacuum ports 114, or all of the ports 112, 114.

After placing a jig base 90 without the lid 92 into the die bonding apparatus 68 (as shown in FIG. 3), vacuum pressure is applied to the lateral vacuum ports 114 to secure a lead-frame against the jig 72. Lead-frame contact points face upwards towards the vacuum chuck 78. A bare die 80 is then positioned on the vacuum chuck 78 with die contact pads facing the lead-frame.

The operator activates the video system to view the lead-frame. The video monitor 88 displays an image of the lead-frame as viewed along the jig's axis of rotation. A first cursor displayed on the video monitor 88 indicates the precise location of the axis of rotation. The operator adjusts the X-Y position of the jig 72 to align a selected structure along the axis of rotation. For example the operator may move the jig 72 so that the image of a terminus of one lead-frame trace appears underneath the first cursor.

The operator then switches the video imaging device 86 to view the bare die 80 on the video monitor 88, again along the axis of rotation of the jig 72. The location of the first cursor (and of the axis of rotation) remains fixed on the video monitor 88, and the operator adjusts the X and Y position of the vacuum chuck 78 to align a die bonding pad with the cursor. In this way, the operator aligns corresponding structures along the jig's axis of rotation.

The operator then moves the video imaging device 86 so as to provide a view away from the jig's axis of rotation. The operator adjusts the video system to position a second cursor over the image of a second selected die contact pad, and then switches to view the lead-frame. The location on the video monitor 88 of the second cursor remains fixed, and the operator rotates the jig 72 to align a corresponding trace terminus to appear underneath the second cursor. In this way, the operator has aligned a second pair of points and completed alignment of the bare die 80 with the lead-frame. The imaging system is moved clear, and the vacuum chuck 78 is dropped to place the bare die 80 onto the adhesive-bearing lead-frame.

Vacuum pressure is then applied through the central vacuum port 112 of the jig 72 to the bare die 80 in order to secure the bare die 80 against the lead-frame. The bare die 80 covers the central lead-frame cut-out 62 in the lead-frame sufficiently well that a pressure difference can be maintained across the top and bottom of the bare die 80 when vacuum pressure is applied. The pressure difference holds the bare die 80 in aligned relationship to the lead-frame.

Vacuum pressure that has been applied through the vacuum chuck 78 to the bare die 80 is then released. The vacuum chuck 78 can then be raised clear, and the square lid 92 mated with the jig base 90. After the square lid 92 is secured, the rod-shaped plunge can be dropped to apply spring force to the bare die 80. Vacuum pressure applied to the bare die 80 through the central vacumm port 112 of the jig base 90 base may optionally be removed, and removable jig 72 can be transported to an oven where the electrically conductive adhesive is cured.

Figure 6:
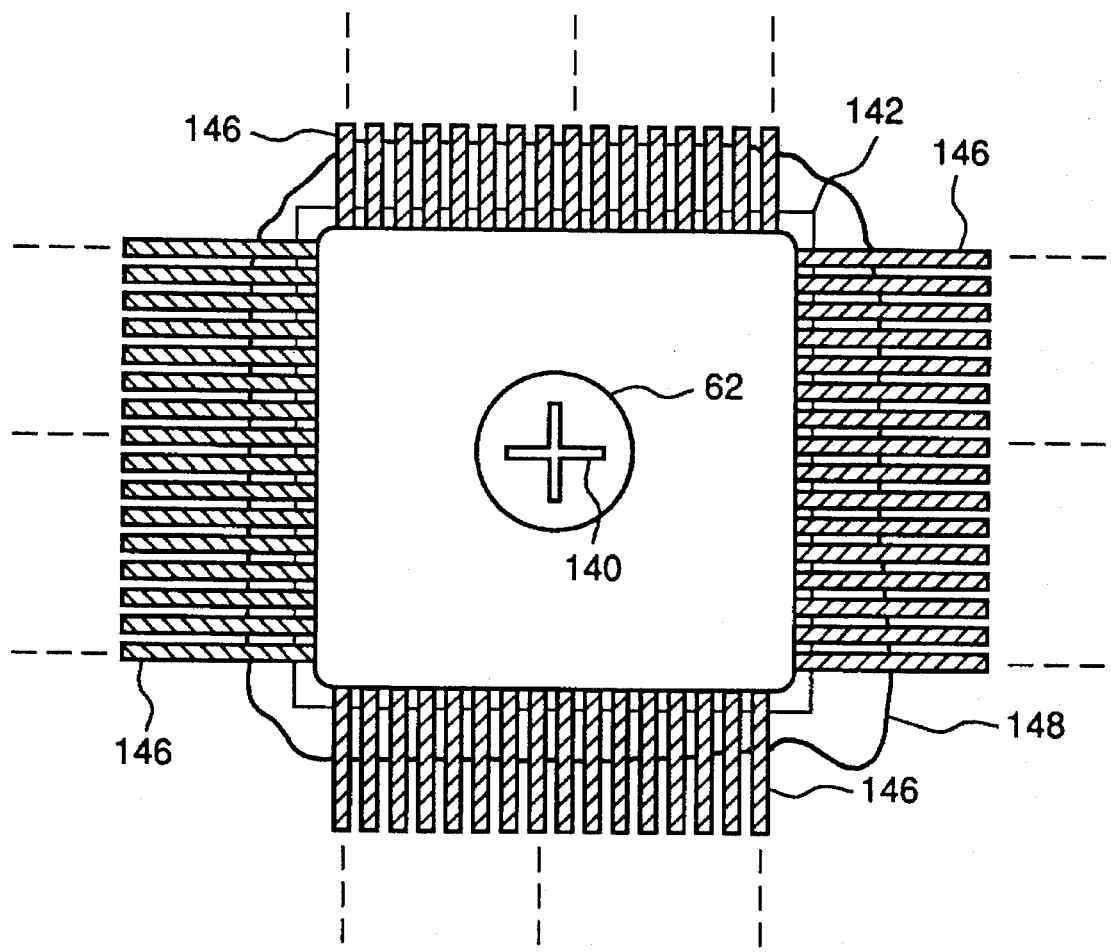
FIG. 6 illustrates a view, through a transparent lead-frame, showing bonding regions of electrically conductive adhesive applied to electrically conductive traces of the lead-frame.

FIG. 6 illustrates a view of a die 142 after bonding to a transparent lead-frame as seen looking through the lead-frame. Comparison with FIG. 2 may assist in recognizing the central circular cutout 62 in the lead frame. The outline of the die 142 is square, and a registration cross 140 on the die can be seen through the central circular cutout 62. Lead-frame traces 146 terminating in the central bonding area overlap the edges of the perimeter of the die 142 (where contact pads are located). In this example, a continuous region of anisotropic conductive adhesive 148 overlaps the traces 146 and portions of the die 142.

After curing, the lead-frame assembly is inverted and applied to a pre-printed flexible substrate 29 with electrically conductive adhesive 34 to complete the structure shown in FIG. 1.

Material Considerations

Unique characteristics of the lead-frame and method discussed above can be enhanced through material selection, especially in selection of the electrically conductive adhesive, in the structure of the die contact pad, and in selection of the polymer lead-frame substrate.

Anisotropic adhesives are preferred when lead pitch is very small—generally when trace centers are less than 10 mils, especially when centers are less than 5 mils. Such adhesives generally achieve their anisotropic characteristic from a controlled concentration of electrically conductive particles dispersed in a curable, polymer dielectric. These adhesives may be applied across lead-frame traces without causing short circuits, which is an advantage in small pitch applications.

However, anisotropic adhesives tend to require relatively high heat and pressure during curing. A die that has been placed can be imagined as floating on a viscous fluid of adhesive. Application of high pressure after positioning may cause the die to shift relative to the lead-frame.

Both isotropic and anisotropic electrically conductive adhesives tend to require curing times which are long relative to the time needed to place a die. Processes which place and cure in the same apparatus suffer low productivity, because placement of a new die must wait for curing of an old die.

The method described above provides relatively high mechanical pressure to be applied in a transportable jig. The initial application of vacuum pressure provides a first force for securing the die alignment while a higher force from the plunger is applied. The presence of a central hole in the lead-frame allows temporary application of a hold-down vacuum pressure to the die. Of course, for adhesives that do not require high force loads, the vacuum pressure may be sufficient to serve as a curing force as well.

Dies may be positioned as quickly as the apparatus will allow without waiting for curing. The use of a removable jig improves manufacturing rates by allowing many jigs to cure simultaneously, rather than waiting for cure in a placement machine. By decoupling the placement and curing operations, advances in placement or curing can individually contribute to improved productivity.

A die contact pad structure that is neither planar nor a simple convex surface is also preferred. The contact pad should have concave regions with depths that can be optimized for anisotropic adhesive particle sizes. For example, when the anisotropic adhesive utilizes seven micron particles, the contact pad should have concavities of at least about one micron. These concavities assist in retaining conductive particles between the die contact pad and the trace. In much the same way that the crown shape of a person's molar teeth help hold food in place while chewing, concavities in the die contact pad hold conductive particles in place when pressure is applied to drive the die down against the conductive particles.

Figure 7:
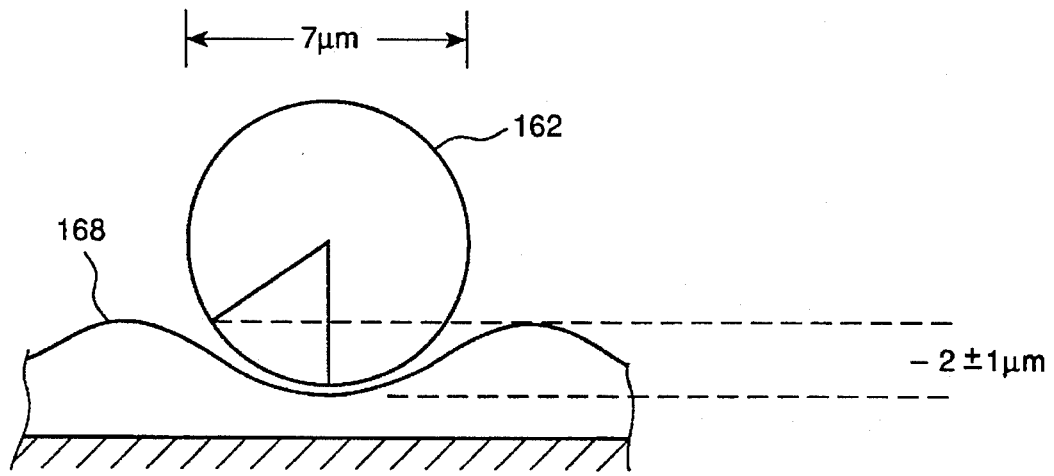
FIGS. 7 and 8 illustrate non-spherical die contact pads and conductive particles of an anisotropic, electrically conductive adhesive.

FIG. 7 illustrates a generic die bonding pad surface having a concavity suitable for use with an anisotropic, electrically conductive adhesive with seven micron particles 162. A non-planar, non-bump, die pad surface 168 approximately two microns above the next highest structure, with variations of at least about ±1 micron, preferably at least about ±2 microns or more. Here, the term "bump" refers to contact pad structure which uses a relatively large mass of metal, typically up to 25 microns across, that assumes a mushroom-cap shape without significant concavities.

Figure 8:
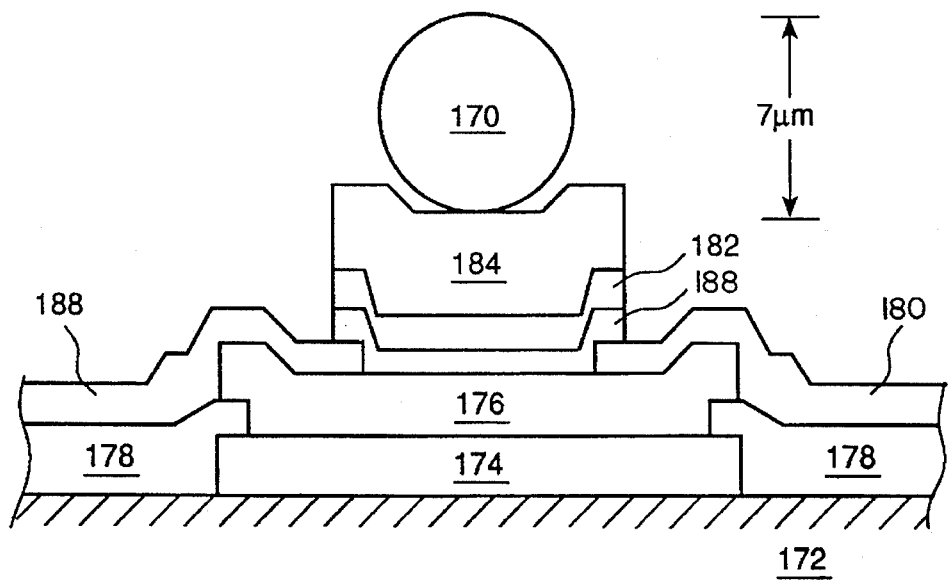

FIG. 8 illustrates a die bonding pad structure also suitable for use with an anisotropic, electrically conductive adhesive with seven micron particles 170. Above the chip substrate 172 are first and second aluminum metal interconnect levels 174, 176. A dielectric layer 178 isolates adjacent metal runs. A passivation layer 180 protects the underlying chip structures away from contact structures. First and second barrier metals layers, one a tin alloy 188 and the other gold 182, provide transitions to a gold contact structure 184 having a non-planar contour with a concavity. The gold contact structure 184 rises at least about two microns above the next highest chip structure and has a concavity of at least about 1 micron, preferable at least about 2 microns, and most preferably more than about 3 microns.

Of course, it should be understood that the concavity depth may vary with the size of the conductive particles in the anisotropic cement. The concavity depth should be at least about one-seventh of the average particle size, preferably at least about two-sevenths, and most effectively at least about three-sevenths. Where there is statistical variation among particle sizes and contact structures, the mean values should satisfy the size requirements, although it is preferred that the distributions be sufficiently narrow that overall yields be commercially acceptable. Size distribution of anisotropic particles should preferably be small so the number of contact pads that encounter a particle that will not be captured, and thus fail to achieve a functioning connection, does not adversely affect overall yields.

The lead-frame substrate should have a coefficient of thermal expansion sufficiently close to that of the die so that, across the diagonal of the die and over a 200 degree C. temperature variation, the difference in expansion will be less than about one half the size of the bonding pad, preferably less than about one quarter, and optimally one eighth. Upilex S polyimide film, for example has a coefficient of expansion of about 8–10 ppm/degree C., as compared to a coefficient for silicon of about 4 ppm/degree C.

After learning of the embodiments described above, people practicing in this art will be able to make variations that fall within the spirit and scope of the invention. The embodiments described above are exemplary but not intended to limit unduly the scope of the invention as defined by the following claims.

What is claimed is:

1. A method for connecting a plurality of contact pads of a die to a respective plurality of contact points of electrically conductive traces on a flexible lead-frame, said method comprising steps of:

applying a curable electrically conductive adhesive to one of said plurality of contact pads and said respective plurality of contact points of said electrically conductive traces;

aligning said plurality of contact pads to said respective plurality of contact points of said electrically conductive traces in alignment apparatus;

bringing said plurality of contact pads into mounting relation with said respective plurality of contact points of said electrically conductive traces such that said curable electrically conductive adhesive fills space between said plurality of contact pads and said respective plurality of contact points of said electrically conductive traces;

applying a securing force to said die and said flexible lead-frame so as to secure said die to said flexible lead-frame;

applying a curing force greater than said securing force to said die and said flexible lead-frame; and curing said curable electrically conductive adhesive in apparatus separate from said alignment apparatus, and while maintaining said curing force applied to said die and said flexible lead-frame.

2. The method according to claim 1, wherein said step of applying said securing force comprises applying a vacuum pressure to said die through a hole in said flexible lead-frame.

3. The method according to claim 1, said method further comprising a step of:

transporting said die and said flexible lead-frame in a jig after said step of bringing said plurality of contact pads into mounting relation with said respective plurality of contact points of said electrically conductive traces and before said step of curing said curable electrically conductive adhesive.

4. The method for connecting said plurality of contact pads of said die to said respective plurality of contact points of electrically conductive traces on said flexible lead-frame according to claim 1, wherein:

said curing force is applied with a plunger.

5. The method for connecting said plurality of contact pads of said die to said respective plurality of contact points of electrically conductive traces on said flexible lead-frame according to claim 1, wherein:

said step of curing is performed in an oven.

6. The method for connecting said plurality of contact pads of said die to said respective plurality of contact points of electrically conductive traces on said flexible lead-frame according to claim 1, wherein:

said curable electrically conductive adhesive is an anisotropic adhesive.

7. The method for connecting said plurality of contact pads of said die to said respective plurality of contact points of electrically conductive traces on said flexible lead-frame according to claim 1, wherein:

said curable electrically conductive adhesive is an isotropic adhesive.

8. The method for connecting said plurality of contact pads of said die to said respective plurality of contact points of electrically conductive traces on said flexible lead-frame according to claim 1, wherein:

said curing force is applied while said securing force is applied; and said securing force is removed before said adhesive is cured.

9. The method for connecting said plurality of contact pads of said die to said respective plurality of contact points of electrically conductive traces on said flexible lead-frame according to claim 1, wherein:

each of said plurality of contact pads has a concave region.

10. The method for connecting said plurality of contact pads of said die to said respective plurality of contact points of electrically conductive traces on said flexible lead-frame according to claim 9, wherein:

a depth of a concavity of said concave region is at least about 2 microns.

11. The method for connecting said plurality of contact pads of said die to said respective plurality of contact points of electrically conductive traces on said flexible lead-frame according to claim 9, wherein:

a depth of a concavity of said concave region is at least about three-sevenths an average particle size in said curable electrically conductive adhesive.

12. The method for connecting said plurality of contact pads of said die to said respective plurality of contact points of electrically conductive traces on said flexible lead-frame according to claim 1, wherein:

said lead-frame substrate has a coefficient of thermal expansion such that over a 200° C. temperature variation, a difference in expansion of said lead-frame substrate will be less than about one-eighth a size of said plurality of contact pads.

13. A method of forming a contact structure on a chip substrate, comprising steps of:

forming a first aluminum metal interconnect level on a chip substrate;

forming a second aluminum metal interconnect level on said first aluminum metal interconnect level;

forming a passivation layer on a first portion of an upper surface of said second aluminum metal interconnect level, said passivation layer exposing a second portion of said upper surface of said second aluminum metal interconnect level;

forming a first barrier metal layer on said second portion of said upper surface of said second aluminum metal interconnect level;

forming a second barrier metal layer on said first barrier metal layer;

forming a gold contact structure on said second barrier metal layer.

14. The method of forming said contact structure according to claim 13, comprising a further step of:

forming a dielectric layer adjacent said first aluminum metal interconnect level.

15. The method of forming said contact structure according to claim 13, wherein:

said first barrier metal layer is a tin alloy; and said second barrier metal layer comprises gold.

16. The method of forming said contact structure according to claim 13, wherein:

said gold contact structure is formed to have a concave surface with a concavity of more than about 3 microns.

17. The method of forming said contact structure according to claim 13, comprising a further step of:

placing particles of electrically conductive adhesive on said gold contact structure.

* * * * *